United States Patent
Oishi et al.

(10) Patent No.: US 12,463,171 B2
(45) Date of Patent: Nov. 4, 2025

(54) COPPER BONDING WIRE FOR SEMICONDUCTOR DEVICES AND SEMICONDUCTOR DEVICE

(71) Applicants: NIPPON MICROMETAL CORPORATION, Saitama (JP); NIPPON STEEL Chemical & Material Co., Ltd., Tokyo (JP)

(72) Inventors: Ryo Oishi, Saitama (JP); Daizo Oda, Saitama (JP); Noritoshi Araki, Saitama (JP); Kota Shimomura, Saitama (JP); Tomohiro Uno, Tokyo (JP); Tetsuya Oyamada, Tokyo (JP)

(73) Assignees: NIPPON MICROMETAL CORPORATION, Saitama (JP); NIPPON STEEL Chemical & Material Co., Ltd., Tokyo (JP)

(*) Notice: Subject to any disclaimer, the term of this patent is extended or adjusted under 35 U.S.C. 154(b) by 574 days.

(21) Appl. No.: 17/781,316

(22) PCT Filed: Nov. 20, 2020

(86) PCT No.: PCT/JP2020/043446
§ 371 (c)(1),
(2) Date: May 31, 2022

(87) PCT Pub. No.: WO2021/111908
PCT Pub. Date: Jun. 10, 2021

(65) Prior Publication Data
US 2023/0013769 A1 Jan. 19, 2023

(30) Foreign Application Priority Data
Dec. 2, 2019 (JP) ................................. 2019-218023

(51) Int. Cl.
*H01L 23/00* (2006.01)
*C22F 1/08* (2006.01)

(52) U.S. Cl.
CPC .... *H01L 24/45* (2013.01); *H01L 2224/45147* (2013.01); *H01L 2924/01203* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01); *H01L 2924/20758* (2013.01); *H01L 2924/20759* (2013.01); *H01L 2924/2076* (2013.01)

(58) Field of Classification Search
CPC ....... H01L 2224/00; H01L 2224/45147; H01L 2924/01203; H01L 2924/20756–20759; H01L 24/45; B23K 35/0261; B23K 35/302
See application file for complete search history.

(56) References Cited

U.S. PATENT DOCUMENTS

| | | | |
|---|---|---|---|
| 2012/0094121 A1 | 4/2012 | Uno et al. | |
| 2017/0332489 A1* | 11/2017 | Kimura | H01B 1/026 |
| 2020/0312808 A1 | 10/2020 | Oda et al. | |
| 2023/0018430 A1 | 1/2023 | Oda et al. | |

FOREIGN PATENT DOCUMENTS

| | | | |
|---|---|---|---|
| CN | 102459668 A | 5/2012 | |
| CN | 10331464 A | 4/2013 | |
| CN | 106119595 A | 11/2016 | |
| CN | 109496347 A | 3/2019 | |
| JP | S61-048543 A | 3/1986 | |
| JP | 3838521 B1 * | 10/2006 | B22D 11/004 |
| JP | 2009-140953 A | 6/2009 | |
| JP | 5053456 B1 | 10/2012 | |
| JP | 2013-26475 A | 2/2013 | |
| JP | 2013026475 A * | 2/2013 | H01L 24/43 |
| JP | 2018-503743 A | 2/2018 | |
| JP | 2019-149559 A | 9/2019 | |
| KR | 10-2012-0031005 A | 3/2012 | |
| SG | 191705 A1 | 8/2013 | |
| TW | 201900888 A | 1/2019 | |
| WO | 2016/105276 A1 | 6/2016 | |
| WO | WO-2017221770 A1 * | 12/2017 | B23K 35/0227 |
| WO | 2018/212327 A1 | 11/2018 | |

OTHER PUBLICATIONS

International Search Report issued in corresponding International Patent Application No. PCT/JP2020/043446, dated Feb. 9, 2021, with English translation.
Masafumi Matsushita et al., "EBSD Analysis of the Submicron Width Fibber Shaped Grain Copper Fabricated by Drawing," Materials Sciences and Application, 2011, 2, pp. 911-916.
Chinese Office Action issued in corresponding Chinese Patent Application No. 202080083559.9, dated Apr. 1, 2023, with English translation.
Singapore Office Action issued in corresponding Singapore Patent Application No. 11202250011E, dated Apr. 11, 2023.
Extended European Search Report issued in corresponding EP Application No. 20896310.8, dated Oct. 30, 2023.
Korean Office Action mailed on Jun. 23, 2025, issued in corresponding Korean Application No. 10-2022-7017877, 9 pages.

* cited by examiner

*Primary Examiner* — Joshua Benitez Rosario
*Assistant Examiner* — Jacob T Nelson
(74) *Attorney, Agent, or Firm* — Rimon P.C.

(57) ABSTRACT

There is provided a copper bonding wire having an improved storage life in the atmosphere. There is specifically provided a copper bonding wire for semiconductor devices characterized in that a density of crystal grain boundary on a surface of the wire is 0.6 ($\mu m/\mu m^2$) or more and 1.6 ($\mu m/\mu m^2$) or less.

5 Claims, No Drawings

COPPER BONDING WIRE FOR SEMICONDUCTOR DEVICES AND SEMICONDUCTOR DEVICE

CROSS-REFERENCE TO RELATED APPLICATIONS

This application is the U.S. National Phase under 35 U.S.C. § 371 of International Application No. PCT/JP2020/043446, filed on Nov. 20, 2020, which claims the benefit of Japanese Application No. 2019-218023, filed on Dec. 2, 2019, the entire contents of each are hereby incorporated by reference.

TECHNICAL FIELD

The present invention relates to a copper bonding wire for semiconductor devices. The present invention further relates to a semiconductor device including the copper bonding wire.

BACKGROUND ART

In semiconductor devices, electrodes formed on a semiconductor chip are connected with electrodes on a lead frame or a substrate using a bonding wire. Conventionally, gold (Au) has been the common material of bonding wires but has been increasingly replaced with copper (Cu) particularly in the LSI applications (for example, Patent Literatures 1 to 3). There has been a growing demand for replacement with Cu also in the power semiconductor applications since Cu has high efficiency and high reliability due to its high thermal conductivity and high fusing current characteristic.

The copper bonding wire is shipped such that, after being wound around a spool to be a wound body, the wound body is sealed in a barrier bag that blocks oxygen, moisture, and the like. Then, the barrier bag is opened immediately before being subjected to connection between electrodes in manufacture of a semiconductor device. Since a bondability of the copper bonding wire is easily deteriorated when surface oxidization proceeds due to influence of oxygen, moisture, and the like in the atmosphere, a storage life of the copper bonding wire after being opened is typically assumed to be one week.

However, the copper bonding wire cannot be used up in one week after being opened, and may be discarded in some cases. Additionally, a wire length (winding length) of the wound body may be limited to being short. In such a case, a frequency of replacing the wound body may be increased, and a manufacturing line may be required to be stopped for each replacement, so that deterioration of manufacturing efficiency is inevitable. Thus, there is a demand for improving the storage life of the copper bonding wire in the atmosphere.

RELATED ART REFERENCE

Patent Literature

Patent Literature 1: JP S61-48543 A
Patent Literature 2: JP 2018-503743 T
Patent Literature 3: WO 2017/221770

SUMMARY OF INVENTION

Problem to be Solved by the Invention

An object of the present invention is to provide a copper bonding wire having an improved storage life in the atmosphere.

Means for Solving Problem

As a result of earnest investigation as to the problem described above, the present inventors have found that the problem described above can be solved by the copper bonding wire having the configuration described below, and further investigated the problem based on such knowledge to complete the present invention.

That is, the present invention includes the following content.

[1] A copper bonding wire for semiconductor devices, wherein a density of crystal grain boundary on a surface of the wire is 0.6 ($\mu m/\mu m^2$) or more and 1.6 ($\mu m/\mu m^2$) or less.

[2] The copper bonding wire according to [1], wherein the density of crystal grain boundary on the surface of the wire is calculated by dividing a total length ($\mu m$) of a crystal grain boundary by a measurement area ($\mu m^2$), where the crystal grain boundary is defined as a boundary at which an orientation difference between adjacent measurement points is 15° or more when measuring by using an EBSD method at measurement point intervals of 0.06 $\mu m$ or more and 0.6 $\mu m$ or less.

[3] The copper bonding wire according to [2], wherein the density of crystal grain boundary on the surface of the wire is measured under the condition that a center of width of a measuring surface is aligned with a center of width of the wire in a direction perpendicular to a longitudinal axis of the wire, the width of the measuring surface is 20% or more and 40% or less of a diameter of the wire, and a length of the measuring surface is five times the width of the measuring surface.

[4] The copper bonding wire according to any one of [1] to [3], comprising copper having a purity of 99.9% by mass or more.

[5] The copper bonding wire according to any one of [1] to [4], wherein the diameter of the wire is 15 $\mu m$ or more and 300 $\mu m$ or less.

[6] The copper bonding wire according to any one of [1] to [5], wherein a breaking strength of the wire is 145 MPa or more.

[7] A semiconductor device comprising the copper bonding wire according Co any one of [1] to [6].

Effect of the Invention

The present invention can provide a copper bonding wire having an improved storage life in the atmosphere.

EMBODIMENT FOR CARRYING OUT THE INVENTION

Hereinafter, the present invention will be described in detail based on a preferred embodiment thereof.

Copper Bonding Wire for Semiconductor Devices

A copper bonding wire for semiconductor devices according to the present invention is characterized in that a density of crystal grain boundary on a surface of the wire is 0.6 ($\mu m/\mu m^2$) or more and 1.6 ($\mu m/\mu m^2$) or less.

As an indicator that indicates a crystal structure of the bonding wire, there is known an average crystal grain size. In order to achieve expected wire properties, there have been conventionally made efforts to adjust such an average crystal grain size to a certain range. For example, in association with an environmental resistance and a bonding reliability of the wire, there have been developed techniques for adding a certain amount of dopant and adjusting the average crystal grain size of the wire to a certain range (for example, JP 2018-503743 T, WO 2017/221770). Thus, the present inventors have investigated an influence of the average crystal grain size of the wire and the like in association with the storage life of the copper bonding wire in the atmosphere. As a result, it was confirmed that the storage life in the atmosphere does not necessarily correlate with the average crystal grain size of the wire.

In a process of earnestly investigating an improvement of the storage life of the copper bonding wire in the atmosphere, the present inventors have found that a density of crystal grain boundary on a surface of the wire closely correlates with the storage life in the atmosphere, and have arrived at the present invention. As represented by an empirical rule of Hall-Petch, the average crystal grain size described above is used as an indicator indicating a bulk characteristic such as a strength characteristic of a polycrystalline material or a bonding strength of a bonding material in some cases. In such a case, the average crystal grain size and the density of crystal grain boundary may be used in the same meaning. However, it was found that, in a case of considering a surface characteristic of a material such as a storage life in the atmosphere, the characteristic does not necessarily correlate with the average crystal grain size, whereas the characteristic closely correlates with the density of crystal grain boundary.

In the present invention, the density of crystal grain boundary means a total length ($\mu m$) of a crystal grain boundary that is present per unit area ($\mu m^2$), which is an indicator indicating an amount of the crystal grain boundary that is present per unit area.

In view of achieving the copper bonding wire having the improved storage life in the atmosphere, an upper limit of the density of crystal grain boundary on the surface of the wire is 1.6 ($\mu m/\mu m^2$) or less, preferably 1.55 ($\mu m/\mu m^2$) or less, more preferably 1.5 ($\mu m/\mu m^2$) or less, 1.45 ($\mu m/\mu m^2$) or less, or 1.4 ($\mu m/\mu m^2$) or less.

In view of achieving the copper bonding wire that exhibits a sufficient breaking strength and can stably form a desired loop shape, a lower limit of the density of crystal grain boundary on the surface is 0.6 ($\mu m/\mu m^2$) or more, preferably 0.65 ($\mu m/\mu m^2$) or more, 0.7 ($\mu m/\mu m^2$) or more, 0.75 ($\mu m/\mu m^2$) or more, 0.8 ($\mu m/\mu m^2$) or more, or 0.85 ($\mu m/\mu m^2$) or more.

In the present invention, the density of crystal grain boundary on the surface of the wire is measured and calculated by using an Electron Backscattered Diffraction (EBSD) method. A measuring surface is the surface of the wire. Specifically, the density of crystal grain boundary on the surface of the wire is calculated by dividing a total length ($\mu m$) of the crystal grain boundary by a measurement area ($\mu m^2$), where the crystal rain boundary is defined as a boundary at which an orientation difference between adjacent measurement points is 15° or more when. measuring by using an EBSD method at measurement point intervals of 0.06 $\mu m$ or more and 0.6 $\mu m$ or less. Herein, the total length of the crystal grain boundary is calculated by EBSD analysis software AZtec HKL (manufactured by Oxford Instruments). Specifically, the total length of the crystal grain boundary is calculated by obtaining the number of the boundary at which an orientation difference between adjacent measurement points is 15° or more in a histogram obtained, and multiplying the number of the boundary by the measurement point interval.

When measuring and calculating the density of crystal grain boundary on the surface of the wire by the EBSD method, a position and dimensions of a measuring surface are determined as follows. In the following description, the width of the measuring surface indicates The dimension of the measuring surface in a direction perpendicular to a longitudinal axis of the wire, and the length of the measuring surface indicates the dimension of the measuring surface in a direction along the longitudinal axis of the wire.

First, a copper bonding wire to be measured is fixed to a sample holder in a linear arrangement. Next, the measuring surface is determined so that a center of width of the measuring surface is aligned with a center of width of the wire in the direction perpendicular to the longitudinal axis of the wire (that is, the center of width of the wire when viewing the surface of the wire from the direction perpendicular to the longitudinal axis of the wire), and the width of the measuring surface is 20% or more and 40% or less of a diameter of the wire. By determining the position and dimensions of the measuring surface as described above, it is possible to measure and calculate the density of crystal grain boundary on the surface of the wire with high accuracy while suppressing influence of a curvature of the wire surface. The length of the measuring surface is set to be 5 times the width of the measuring surface. It is preferable to perform the measurement for measuring surfaces at a plurality of points (n≥3) which are separated from each other by 1 mm or more in the longitudinal direction of the wire, and employ an average value thereof.

The copper bonding wire according to the present invention is composed of copper or a copper alloy. In view of further achieving the effect of the present invention, the content of copper in the wire is preferably 99.9% by mass or more, more preferably 99.99% by mass or more, or 99.999% by mass or more.

A dopant which is known Co be able to impart an environmental resistance may be added Co the copper bonding wire according to the present invention. Examples of the dopant may include a rare earth element such as scandium (Sc) and yttrium (Y), phosphorus (P), tin (Sn), zinc (Zn), nickel (Ni), and silicon (Si). The content of the dopant in the wire may be 1 ppm by mass or more, 3 ppm by mass or more, 5 ppm by mass or more, 10 ppm by mass or more, or the like. An upper limit of the content may be 500 ppm by mass or less, 400 ppm by mass or less, 300 ppm by mass or less, 200 ppm by mass or less, or the like. Thus, in an embodiment, the copper bonding wire according to the present invention contains 1 to 500 ppm by mass of at least one element selected from the group consisting of the rare earth element, P, Sn, Zn, Ni, and Si. Even in a case of not adding such a dopant, or a case in which an addition amount thereof is extremely small (for example, 100 ppm. by mass or less, 50 ppm by mass or less, or 30 ppm by mass or less), the copper bonding wire according to the present invention can exhibit a favorable storage life in the atmosphere. According to a preferable embodiment, the copper bonding wire according to the present invention consists of copper and inevitable impurities.

A diameter of the copper bonding wire according to the present invention is not particularly limited, but may be appropriately determined depending on specific purposes. Preferably, the diameter of the copper bonding wire may be 15 μm or more, 18 μm or more, 20 μm or more, or the like. An upper limit of the diameter is not particularly limited, but may be 300 μm or less, 250 μm or less, 200 μm or less, 150 μm or less, 100 μm or less, 80 μm or less, 60 μm or less, 50 μm or less, or the like. Thus, in an embodiment, the diameter of the copper bonding wire according to the present invention is 15 μm or more and 300 μm or less.

<Manufacturing Method for Wire>

There will be described an example of a method for manufacturing the copper bonding wire for semiconductor devices according to the present invention.

Raw material copper having a purity of 3 N to 6 N (99.9 to 99.9999% by mass) is processed to have a large diameter by continuous casting, and subsequently, thinned to have a final wire diameter by wire drawing.

In a case of adding a dopant, a copper alloy containing a required concentration of dopant may be used as a raw material. In a case of adding a dopant, a dopant component having high purity may be directly added, or a mother alloy containing a dopant component at a concentration of about 1% may be used. Alternatively, a dopant component may be attached to a surface of the wire during the wire manufacturing process to be contained therein. In this case, this process may be incorporated in any process of the wire manufacturing process, or may be incorporated in a plurality of processes. An attaching method can be selected from among (1) application of aqueous solution, drying, and then heat treatment, (2) a plating method (wet), and (3) a vapor deposition method (dry).

The wire drawing process can be performed by using a continuous wire drawing machine in which a plurality of diamond-coated dies can be set. If necessary, heat treatment may be performed during the wire drawing process.

After the wire drawing process, surface refining heat treatment is performed. In view of achieving the copper bonding wire having the density of crystal grain boundary on the surface thereof that falls within the desired range, the surface refining heat treatment is preferably performed at a high temperature for a short time. Although depending on a processing degree and the like of the wire drawing process, the temperature of the surface refining heat treatment is preferably determined within a range from 0.6 Tm to 0.8 Tm when defining that a melting point of copper is Tm (K). The melting point Tm of copper is 1358 K (=1085° C.), so that the temperature of the surface refining heat treatment preferably falls within a range from 540° C. to 820° C. A time for the surface refining heat treatment is preferably set to be several seconds at the longest (for example, 7 seconds or less, 5 seconds or less, or 4 seconds or less).

In view of achieving the copper bonding wire having the density of crystal grain boundary on the surface thereof that fails within the desired range, the surface refining heat treatment is preferably performed in the presence of an atmospheric gas having high thermal conductivity. Thereby, a process time required for raising the temperature of the wire surface can be shortened, and the density of crystal grain boundary on the surface of the wire can be easily adjusted to fall within the desired range. A thermal conductivity of gas usually becomes higher as a molecular weight thereof becomes smaller. Accordingly, the atmospheric gas for the surface refining heat treatment may be preferably an inert gas containing hydrogen, for example, a helium gas containing hydrogen, a nitrogen gas containing hydrogen, and an argon gas containing hydrogen. A hydrogen concentration in the inert gas containing hydrogen may fall within a range from 1 to 20%, for example. In a preferable embodiment, the atmospheric gas for the surface refining heat treatment is a forming gas (5% $H_2N_2$). Alternatively, an inert gas such as a nitrogen gas or an argon gas may be used as the atmospheric gas under strict control for the temperature and the time for the heat treatment.

The copper bonding wire according to the present invention has an excellent storage life in the atmosphere since it has the density of crystal grain boundary on the surface thereof that falls within the desired range. The copper bonding wire according to the present invention also has a favorable strength due to a crystal structure within the wire. For example, a breaking strength of the copper bonding wire according to the present invention is preferably 145 MPa or more, more preferably 150 MPa or more, 155 MPa or more, or 160 MPa or more. An upper limit of the breaking strength is not particularly limited, but may be usually 250 MPa or less, 200 MPa or less, or the like. The breaking strength of the copper bonding wire can be measured by using a method in "Breaking strength" described later.

After the manufacture of the copper bonding wire according to the present invention, the wire may be wound around a spool to form a wire wound body. The copper bonding wire according to the present invention has the excellent storage life in the atmosphere, so that a problem of oxidative deterioration is hardly caused even in a case of winding a long wire. Thereby, the copper bonding wire according to the present invention greatly contributes to improvement in production efficiency of a semiconductor device.

The copper bonding wire according to the present invention can be used for connecting an electrode on a semiconductor chip to an electrode on a lead frame or a circuit board when manufacturing the semiconductor device. First connection (1st bonding) with the electrode on the semiconductor chip may be ball bonding or wedge bonding. In the ball bonding, a tip end of the wire is heated and molten by arc heat input to form a ball (FAB: Free Air Ball) by surface tension, and then this ball part is compression-bonded onto the electrode of the heated semiconductor element. In the wedge bonding, the wire part is compression-bonded onto the electrode by applying heat, ultrasonic waves, and pressure to the wire part without forming the ball. The copper bonding wire according to the present invention having the density of crystal grain. boundary on the surface thereof that falls within the desired range has the excellent storage life in the atmosphere even when a dopant is not added Cr an addition amount thereof is extremely small. Thereby, using the copper bonding wire according to the present invention, the ball can be prevented from being hardened by an oxide or a dopant, and the chip can be prevented from being damaged at the time of ball bonding. Furthermore, the copper bonding wire according to the present invention having the excellent storage life in the atmosphere can prevent a bonding failure from being caused by oxidative deterioration of the wire after being stored in the atmosphere for a long time, and it is possible to secure a wide process window. Second connection (2nd bonding) with the electrode on the lead frame or the circuit board may be wedge bonding, and a wide process window can be secured as described above by using the copper bonding wire according to the present invention.

Semiconductor Device

The semiconductor device can be manufactured by connecting the electrode on the semiconductor chip to the electrode on the lead fraise or the circuit board by using the copper bonding wire for semiconductor devices according to the present invention.

In an embodiment, the semiconductor device according to the present invention includes a circuit board, a semiconductor chip, and a copper bonding wire for electrically connecting the circuit board and the semiconductor chip with each other, and is characterized in that the copper bonding wire is the copper bonding wire according to the present invention.

In the semiconductor device according to the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP 2002-246542 A, the semiconductor device may include a lead frame and a semiconductor chip mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like, and a semiconductor device for electric power (power semiconductor device) is especially preferred.

EXAMPLES

There will be specifically described the present invention with Examples. However, the present invention is not limited to the Examples described below.

Sample

First, the method of preparing a sample will be described. As Cu as a raw material of the wire, Cu having a purity of 99.9% by mass or more (3 N) to 99.999% by mass or more (5 N) with the balance composed of inevitable impurities was used. The copper having such a given purity was subjected to continuous casting to manufacture the wire material having a wire diameter of several millimeters. In a case of adding dopants Sn, P and Ni, the dopants Sn, P and Ni having a purity of 99% by mass or more with the balance being composed of inevitable impurities were used, or alternatively a mother alloy of Cu with a high concentration of the dopants was used. The dopants were added to the copper having the given purity described above so that the content of the dopants therein reaches a desired value, and then the wire material was manufactured by continuous casting so as to have a wire diameter of several millimeters. The resultant wire material was drawn to manufacture the wire having a diameter of 0.3 to 1.4 mm. In the wire drawing, a commercially available lubricant was used, and the wire drawing rate was 20 to 150 m/min. Also, in the wire drawing, acid washing with hydrochloric acid or the like was performed to remove an oxide film on the wire surface, and subsequently, wire drawing process was performed using a plurality of dies having an area reduction ratio of a range from 10 to 26% (at least half of all the dies had an area reduction ratio of 18% or more), and the wire was processed to have a final wire diameter. During the wire drawing process, heat treatment was performed 0 to 2 times at 200 to 600° C. for 5 to 15 seconds as needed. The final wire diameter was a diameter of 20 μm (Examples 1 to 11, 15 to 17, and Comparative Examples 1 to 4, and 7), and 30 μm (Examples 12 to 14, and Comparative Examples 5 and 6). In manufacturing of Examples 1 to 17, surface refining heat treatment was performed at 540 to 820° C. for several seconds at the longest after the wire drawing process. On the other hand, in manufacturing of Comparative Examples 1, 4 and 5, tempering heat treatment was performed at 500 to 650° C. for 10 seconds or more, and in manufacturing of Comparative Examples 2, 3, 6, and 7, tempering heat treatment was performed at 350 to 600° C. for 1 to 10 seconds. The heat treatment was performed while continuously sweeping the wire under a flow of a forming gas (5% $H_2$—$N_2$).

Test and Evaluation Methods

There will be described test and evaluation methods.
[Density of Crystal Grain Boundary on Surface]

The crystal grain boundary was measured and the density of crystal grain boundary was calculated by using the EBSD method where the measuring surface was a surface of the wire as follows.

The bonding wire to be measured was fixed to the sample holder in a linear arrangement. Next, the measuring surface was determined so that the center of width of the measuring surface was aligned with the center of width of the wire in the direction perpendicular to the longitudinal axis of the wire, and the width of the measuring surface was 20% or more and 40% or less of the diameter of the wire. The length of the measuring surface was set to be five times the width of the measuring surface. Measurement was performed by using an EBSD measurement device (AZtec EBSD system manufactured by Oxford Instruments) with acceleration voltage of 15 kV at measurement point intervals of 0.06 to 0.6 μm. Then, analysis was performed by the EBSD analysis software (AZtec HKL manufactured by Oxford Instruments), and the total length (μm) of the crystal grain boundary was obtained by defining the crystal grain boundary as a boundary at which the orientation difference between adjacent measurement points was 15° or more. Specifically, the total length (μm) of the crystal grain boundary was calculated by obtaining the number of the boundary at which the orientation difference between adjacent measurement points was 15° or more in the histogram obtained, and multiplying the number of the boundary by the measurement point interval. The density of crystal grain boundary ($\mu m/\mu m^2$) on the surface of the wire was calculated by dividing the obtained total length (μm) of the crystal grain boundary by the measurement area ($\mu m^2$).

The measurement by the EBSD method was performed on the measuring surfaces at three points which were separated from each other by 1 mm or more in the longitudinal direction of the, wire, and an average value thereof was employed.
[Breaking Strength]

The breaking strength of the wire was measured by tensile test under the condition that a distance between gauge points was 100 mm, a testing speed was 10 mm/minute, and a load cell rating load was 5 N, by using a tensile testing machine manufactured by Instron. In this test, a breaking load was defined as a value obtained by dividing a load with which the wire was broken by a cross-sectional area of the wire at an initial stage (before the test). The measurement was performed five times, and an average value obtained therefrom was employed as the breaking strength of the sample.
[2nd Bonding Window]

2nd bonding window test is a test for determining the number of conditions with which the bonding was made possible among a total of 36 conditions for 2nd bonding. Specifically, as for the wire having the diameter of 20 μm, the test is conducted under a total of 36 conditions as indicated in Table 1 that indicates 6 stages of ultrasonic current at the time of 2nd bonding from 50 mA to 100 mA in 10 mA increments in the horizontal axis, and 6 stages of load at the time of 2nd bonding from 40 gf to 90 gf in 10 gf increments in the vertical axis. As for the wire having the diameter of 30 μm, the test is conducted under a total of 36 conditions as indicated in. Table 2 that indicates t stages of ultrasonic current from 130 mA to 180 mA in 10 mA increments is the horizontal axis, and 6 stages of load from 90 gf to 140 gf in 10 gf increments in the vertical axis.

TABLE 1

| | | Ultrasonic current (mA) | | | | | |
|---|---|---|---|---|---|---|---|
| | | 50 | 60 | 70 | 80 | 90 | 100 |
| Load (gf) | 40 | | | | | | |
| | 50 | | | | | | |
| | 60 | | | | | | |
| | 70 | | | | | | |
| | 80 | | | | | | |
| | 90 | | | | | | |

TABLE 2

| | | Ultrasonic current (mA) | | | | | |
|---|---|---|---|---|---|---|---|
| | | 130 | 140 | 150 | 160 | 170 | 180 |
| Load (gf) | 90 | | | | | | |
| | 100 | | | | | | |
| | 110 | | | | | | |
| | 120 | | | | | | |
| | 130 | | | | | | |
| | 140 | | | | | | |

This test was performed on each wire of Examples and Comparative Examples at different five timings including (i) a day on which the wire was manufactured, (ii) a timing after the wire was stored in the atmosphere for one week, (iii) a timing after the wire was stored in the atmosphere for two weeks, (iv) a timing after the wire was stored is the atmosphere for three weeks, and (v) a timing after the wire was stored in the atmosphere for four weeks, after the wire was manufactured. Specifically, by using a commercially available wire bonder, 200 wires were bonded to leads of a lead frame for each condition. An Ag-plated lead frame was used as the lead frame, and bonding was performed at a stage temperature of 200° C. under a flow of the forming gas (5% $H_2$—$N_2$) at a flow rate of 0.5 L/min. The number of conditions with which continuous bonding was able to be performed without causing problems such as non-bonding or stop of the bonder was determined, and evaluated in accordance with the following criteria.

Evaluation Criteria:
 ◉: 33 conditions or more
 ○: 30 to 32 conditions
 Δ: 26 to 29 conditions
 X: 25 conditions or less

[Loop Shape Stability]

In the evaluation of the loop shape stability, 40 trapezoid loops were connected so as to achieve a wire Length of 3 mm and a loop height of 250 μm, and the loop shape stability (reproducibility of a loop profile) was evaluated based on a standard deviation of the height. An optical microscope was used for measuring the height, and measurement was performed at two positions including the vicinity of a topmost point of the loop and a center part of the loop. A case in which the standard deviation of the loop height was equal to or larger than ½ of the diameter of the wire was determined that the variations in loop shape was large, and a case in which the standard deviation of the loop height was smaller than ½ of the diameter of the wire was determined that the variations in loop shape was small and favorable. Evaluation was then performed in accordance with criteria indicated by Table 3.

TABLE 3

| | | Topmost | |
|---|---|---|---|
| | | Large variations | Small variations |
| Center | Large variations | X | ○ |
| | Small variations | ○ | ◉ |

Evaluation results of Examples and Comparative Examples are shown in Table 4.

TABLE 4

| | No. | Diameter of wire μm | Purity of copper wt % | Dopant wtppm | Density of crystal grain boundary on surface μm/μm² | Breaking strength MPa | Evaluation of 2nd bonding window | | | | | Loop shape stability |
|---|---|---|---|---|---|---|---|---|---|---|---|---|
| | | | | | | | Manufacture day | After 1 week | After 2 weeks | After 3 weeks | After 4 weeks | |
| Example | 1 | 20 | 99.99 | — | 1.01 | 176 | ◉ | ◉ | ◉ | ○ | Δ | ◉ |
| | 2 | 20 | 99.99 | — | 0.91 | 167 | ◉ | ◉ | ◉ | ○ | ○ | ◉ |
| | 3 | 20 | 99.99 | — | 0.60 | 145 | ◉ | ◉ | ◉ | ○ | ○ | ○ |
| | 4 | 20 | 99.99 | — | 0.62 | 148 | ◉ | ◉ | ◉ | ○ | ○ | ○ |
| | 5 | 20 | 99.9 | — | 1.29 | 192 | ◉ | ◉ | ◉ | ○ | Δ | ◉ |
| | 6 | 20 | 99.99 | — | 0.94 | 164 | ◉ | ◉ | ◉ | ○ | ○ | ◉ |
| | 7 | 20 | 99.999 | — | 1.46 | 202 | ○ | ○ | ○ | Δ | Δ | ◉ |
| | 8 | 20 | 99.99 | — | 1.59 | 214 | ○ | ○ | ○ | Δ | Δ | ◉ |
| | 9 | 20 | 99.9 | — | 1.27 | 189 | ◉ | ◉ | ◉ | ○ | Δ | ◉ |
| | 10 | 20 | 99.999 | — | 0.80 | 158 | ◉ | ◉ | ◉ | ○ | ○ | ○ |
| | 11 | 20 | 99.99 | — | 0.91 | 164 | ◉ | ◉ | ◉ | ○ | Δ | ◉ |
| | 12 | 30 | 99.99 | — | 0.87 | 161 | ◉ | ◉ | ◉ | ○ | ○ | ○ |
| | 13 | 30 | 99.999 | — | 1.31 | 195 | ◉ | ◉ | ◉ | ○ | Δ | ◉ |
| | 14 | 30 | 99.99 | — | 1.48 | 205 | ○ | ○ | ○ | Δ | Δ | ◉ |
| | 15 | 20 | 99.99 | Sn 20 | 1.11 | 180 | ◉ | ◉ | ◉ | ○ | Δ | ◉ |

TABLE 4-continued

|  | No. | Diameter of wire μm | Purity of copper wt % | Dopant wtppm | Density of crystal grain boundary on surface μm/μm² | Breaking strength MPa | Evaluation of 2nd bonding window | | | | | Loop shape stability |
|---|---|---|---|---|---|---|---|---|---|---|---|---|
|  |  |  |  |  |  |  | Manufacture day | After 1 week | After 2 weeks | After 3 weeks | After 4 weeks |  |
|  | 16 | 20 | 99.99 | P 30 | 0.97 | 176 | ◎ | ◎ | ◎ | ○ | △ | ◎ |
|  | 17 | 20 | 99.9 | Ni 120 | 1.22 | 192 | ◎ | ◎ | ◎ | ○ | △ | ◎ |
| Comparative Example | 1 | 20 | 99.99 | — | 0.41 | 139 | ◎ | ◎ | ◎ | ○ | ○ | X |
|  | 2 | 20 | 99.99 | — | 1.69 | 227 | ○ | ○ | △ | X | X | ◎ |
|  | 3 | 20 | 99.99 | — | 2.10 | 243 | X | X | X | X | X | ◎ |
|  | 4 | 20 | 99.9 | — | 0.33 | 126 | ◎ | ◎ | ◎ | ○ | ○ | X |
|  | 5 | 30 | 99.99 | — | 0.53 | 132 | ◎ | ◎ | ◎ | ○ | ○ | X |
|  | 6 | 30 | 99.999 | — | 2.10 | 236 | X | X | X | X | X | ◎ |
|  | 7 | 20 | 99.99 | Ag 15 | 1.81 | 227 | ○ | ○ | △ | X | X | ◎ |

Regarding all of Examples Nos. 1 to 17, the density of crystal Grain boundary on the surface of the wire falls within the range of the present invention, and it was confirmed that a bonding failure due to oxidative deterioration could be prevented even after the wire had been stored in the atmosphere, and a wide process window was able to be secured. It was also confirmed that all of Examples Nos. 1 to 17 achieved the excellent reproducibility of the loop profile and favorable loop shape stability. When the surface of the wire was observed with an SEM (magnification of 10,000; a secondary electron image), a surface defect was not observed in Examples Nos. 1 to 6, 9 to 13, and 15 to 17, but a few surface defects were observed in Examples Nos. 7, 8, and 14. The surface defect is not a flaw or a scratch that can be seen with an optical microscope, but a minute defect that can be observed with an electron microscope. The surface defect is considered to be formed mainly by being brought into contact with dies at the time of wire drawing.

On the other hand, regarding Comparative Examples Nos. 1 to 7, the density of crystal grain boundary on the surface of the wire was out of the range of the present invention, and it was confirmed that a bonding failure due to oxidative deterioration was caused, and thereby resulted in a small process window or a poor loop shape stability. When the surface of the wire was observed with an SEM (magnification of 10,000; a secondary electron image), a surface defect was not observed in Comparative Examples Nos. 1, 4, and 5, a few surface defects were observed in Comparative Examples Nos. 2 and 7, and many surface defects were observed in Comparative Examples Nos. 3 and 6.

Additionally, it was also confirmed that wires having a wire diameter of 100 μm, 200 μm and the like exhibited the similar behavior as the above Examples when the density of crystal grain boundary on the surface of the wire fell within the range of the present invention.

The invention claimed is:

1. A copper bonding wire for semiconductor devices, wherein a density of crystal grain boundary on a surface of the wire is 0.6 (μm/μm²) or more and 1.6 (μm/μm²) or less,
    wherein the density of crystal grain boundary refers to a total length (μm) of a crystal grain boundary that is present per unit area (μm²),
    wherein the density of crystal grain boundary on the surface of the wire is calculated by dividing the total length (μm) of the crystal grain boundary by a measurement area (μm²), where the crystal grain boundary is defined as a boundary at which an orientation difference between adjacent measurement points is 15° or more when measuring by using an EBSD method at measurement point intervals of 0.06 μm or more and 0.6 μm or less, and
    wherein the density of crystal grain boundary on the surface of the wire is measured under the condition that a center of width of a measuring surface is aligned with a center of width of the wire in a direction perpendicular to a longitudinal axis of the wire, the width of the measuring surface is 20% or more and 40% or less of a diameter of the wire, and a length of the measuring surface is five times the width of the measuring surface.

2. The copper bonding wire according to claim 1, comprising copper having a purity of 99.9% by mass or more.

3. The copper bonding wire according to claim 1, wherein the diameter of the wire is 15 μm or more and 300 μm or less.

4. The copper bonding wire according to claim 1, wherein a breaking strength of the wire is 145 MPa or more and 250 MPa or less.

5. A semiconductor device comprising the copper bonding wire according to claim 1.

* * * * *